(12) United States Patent
Baseman et al.

(10) Patent No.: US 7,962,302 B2
(45) Date of Patent: Jun. 14, 2011

(54) PREDICTING WAFER FAILURE USING LEARNED PROBABILITY

(75) Inventors: Robert Jeffrey Baseman, Brewster, NY (US); Susan G. Conti, Hopewell Junction, NY (US); William A. Muth, Lagrangeville, NY (US); Michal Rosen-Zvi, Jerusalem (IL); Frederick A. Scholl, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 144 days.

(21) Appl. No.: 12/329,868

(22) Filed: Dec. 8, 2008

(65) Prior Publication Data

US 2010/0145646 A1 Jun. 10, 2010

(51) Int. Cl.
*G06F 19/00* (2006.01)
(52) U.S. Cl. ............ 702/82; 702/81; 702/83; 702/84; 716/136; 700/108; 700/109; 700/110
(58) Field of Classification Search .......... 702/81–84; 716/136; 700/108–110
See application file for complete search history.

(56) References Cited

U.S. PATENT DOCUMENTS

| 7,076,320 | B1 | 7/2006 | Phan et al. |
| 7,159,205 | B1 | 1/2007 | Amblard et al. |
| 7,187,796 | B1 | 3/2007 | Phan et al. |
| 2005/0188342 | A1* | 8/2005 | Goodwin ............... 716/21 |
| 2005/0262394 | A1 | 11/2005 | Yasukawa et al. |

OTHER PUBLICATIONS

Rejimon et al. "Time and Space Efficient Method for Accurate Computation of Error Detection Probabilities in VLSI Circuits," 2005.*
L.A. Binns et al., "Bayesian Networks in Overlay Recipe Optimization," Data Analysis and Modeling Process Control, Proc. SPIE, 2005, pp. 119-125, Washington, vol. 5755.
T. Rejimon et al., "Time and Space Efficient Method for Accurate Computation of Error Detection Probabilities in VLSI Circuits," IEE Proceedings—Computers and Digital Techniques, Sep. 2005, p. 679-685 pp. 1-10, vol. 152, Issue 5.
E. Bertino et al., "Applying Data Mining Techniques to Wafer Manufacturing," SPIE—The International Society for Optical Engineering, 2005, 12 pages.

* cited by examiner

*Primary Examiner* — Sujoy K Kundu
(74) *Attorney, Agent, or Firm* — Suzanne Erez; Ryan, Mason & Lewis, LLP

(57) ABSTRACT

Techniques for estimating a quality of one or more wafers are presented. One or more first wafers comprising one or more first dies are tested. A probability of wafer failure is determined in accordance with one or more first test measurements of the one or more first dies. A pass status and/or a fail status of one or more second wafers is inferred by testing a select one or more second dies of the one or more second wafers and evaluating one or more second test measurements of the select one or more second dies in accordance with the determined probability of wafer failure.

20 Claims, 3 Drawing Sheets

400

PREDICTING WAFER FAILURE USING LEARNED PROBABILITY

FIELD OF THE INVENTION

The present invention relates generally to integrated circuits and, more particularly, to techniques for predicting the quality of an integrated circuit.

BACKGROUND OF THE INVENTION

The long and complicated process of creating integrated circuits on a silicon wafer involves many performance tests at each manufacturing step. Performance tests are carried out to ensure the quality of manufactured circuits. One challenge of performance testing is balancing the cost of testing with quality. For example, performing a quality test on each and every die (e.g., chip) on a wafer may be costly and time consuming, but the tests may guarantee high chip quality. In the alternative, a tester may limit the number of tests performed to reduce costs; however, by failing to test each and every die on a wafer, there is a risk of overlooking defective chips.

Under conventional techniques, one way of minimizing the number of costly performance tests is to test a sample of chips on a wafer and run more extensive tests only if the initial tests indicate that a problem exists. This technique is used in in-line metrology tests, such as level-to-level overlay alignment tests. In overlay alignment tests, it is sufficient to identify one chip on a wafer that is not aligned properly in order to conclude a failure of the entire wafer. However, since the status (e.g., pass or fail) of a wafer is based on a limited sample of tested chips, a failing wafer may be overlooked when the wafer contains defective chips, but those defective chips fall outside the sample of tested chips. Currently, sample testing does not accurately reflect the quality of an entire wafer.

SUMMARY OF THE INVENTION

Principles of the present invention provide techniques that overcome the above-mentioned drawbacks associated with existing sample testing methods by providing techniques that address the above needs, as well as other needs. Particularly, principles of the invention provide techniques for inferring the quality of a wafer using previously obtained wafer testing data.

For example, in one embodiment of the invention, a technique for estimating a quality of one or more wafers is provided. One or more first wafers comprising one or more first dies are tested. A probability of wafer failure is determined in accordance with one or more first test measurements of the one or more first dies. A pass status and/or a fail status of one or more second wafers is inferred by testing a select one or more second dies of the one or more second wafers and evaluating one or more second test measurements of the select one or more second dies in accordance with the determined probability of wafer failure.

The step of determining a probability of wafer failure may further comprise generating a Bayesian network in accordance with the one or more first test measurements of the one or more first dies. The one or more first test measurements may be in accordance with a level-to-level overlay alignment test. The Bayesian network may comprise a root node representing a pass probability of a wafer and/or a fail probability of a wafer. Further, the root node may comprise a node representing a probability related to a maximum shift and/or a node representing a probability related to a standard shift.

In additional embodiments, the above technique for estimating a quality of one or more wafers may be carried out by an apparatus and/or a computer program product. These and other objects, features, and advantages of the present invention will become apparent from the following detailed description of illustrative embodiments thereof, which is to be read in connection with the accompanying drawings.

DETAILED DESCRIPTION OF PREFERRED EMBODIMENTS

The present invention will be described in conjunction with exemplary methods for inferring a quality of one or more wafers using one or more test measurements from one or more previously tested wafers. In an exemplary embodiment, the present disclosure will illustrate how to determine the probability of wafer failure using a Bayesian network. It should be understood, however, that the invention is not limited to the particular embodiments described herein and modifications to the illustrative embodiments will become apparent to those skilled in the art given the teachings described herein.

Currently, there are no reliable methods of inferring the quality of a wafer with limited testing. Conventional techniques rely on testing a select number of dies on a wafer to determine if a wafer should pass or fail; however, these techniques base the status (e.g., pass or fail) of a wafer on the select number of tested dies without any additional statistical analysis. Unlike conventional techniques, the present invention may allow a circuit tester to accurately infer the status of a wafer with limited testing by applying a probabilistic model. In one illustrative embodiment, a tester may infer the failure of a partially tested wafer based on: (a) one or more test measurements from one or more select dies of the partially tested wafer; and (b) a probability model generated in accordance with one or more test measurements from one or more previously tested wafers, which were manufactured under the same process and conditions as the partially tested wafer.

Figure 1:
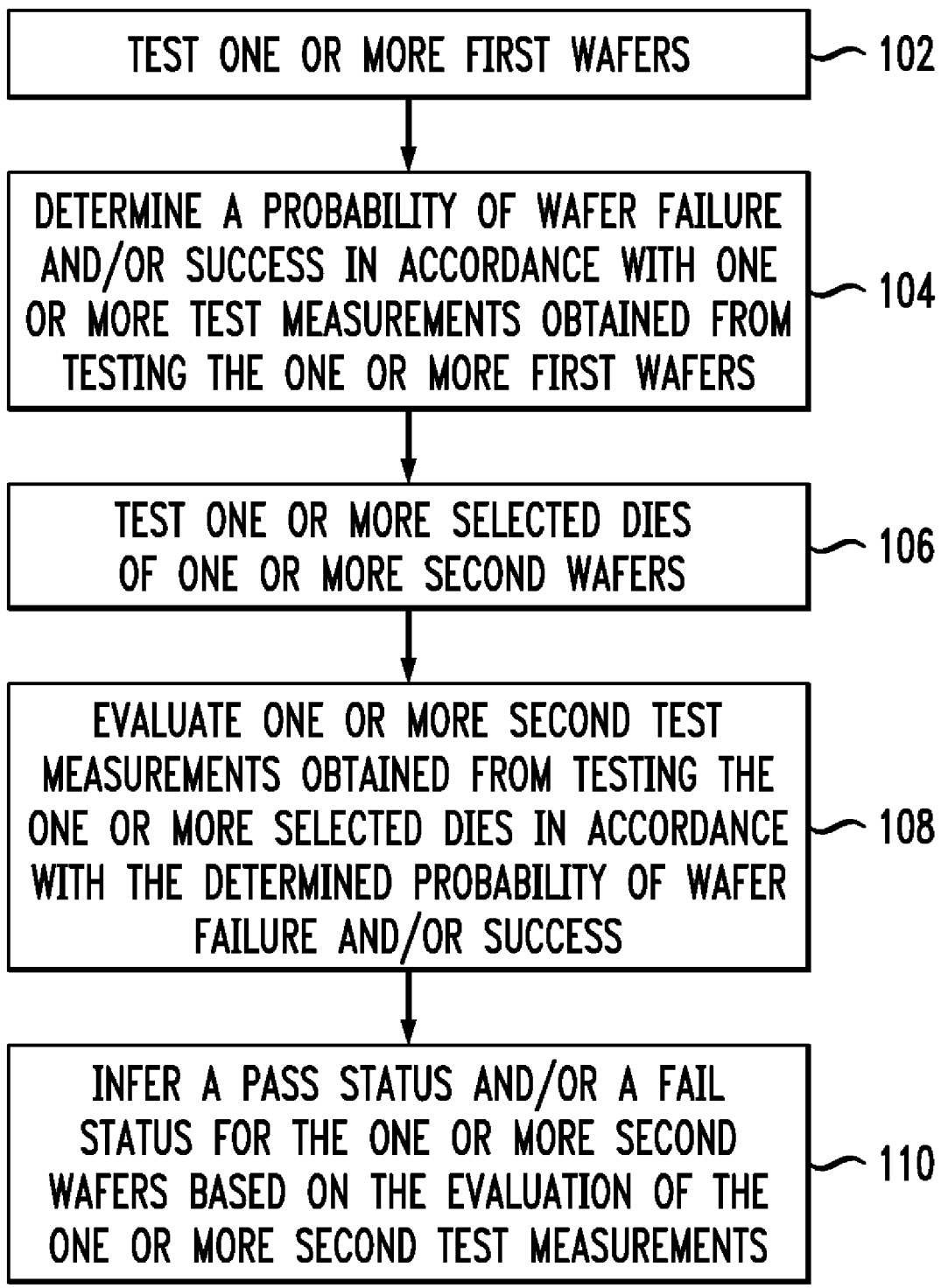
FIG. 1 is a flow diagram illustrating an exemplary methodology for estimating a quality of one or more wafers, according to an embodiment of the present invention.

Referring initially to FIG. 1, a flow diagram illustrates an exemplary methodology for estimating a quality of one or more wafers, according to an embodiment of the present invention. In an illustrative embodiment, methodology 100 may be carried out on a computer-based device, such as a personal computer and/or a server. Methodology 100 begins at step 102 where one or more dies of one or more first wafers are tested. The one or more first wafers may be part of an initial batch of processed wafers of a wafer manufacturing job. In an exemplary embodiment, all of the dies of the one or more first wafers are tested using a standard wafer testing method. For example, a level-to-level overlay alignment test may be performed and the relative shift for each die may be measured. In an overlay alignment test, if the absolute value of the shift for a given die is greater than a pre-determined value (e.g., according to die manufacturing specifications), the die fails the test and so does the wafer. It should be appreciated that any number of dies of the one or more first wafers may be tested and testing all of the dies of the one or more first wafers is not required; however, it should be noted that the accuracy of the present invention to infer wafer failure or success may increase as more dies are tested during this initial step.

The one or more test measurements from the one or more first wafers may provide important information about the passing probability and/or failing probability of subsequent wafers manufactured under the same process and conditions as the one or more first wafers. For example, subsequent wafer batches of a wafer manufacturing job may reflect a consistent passing probability and/or failing probability as initial wafer batches. In one illustrative embodiment, one or more test measurements from one or more initially tested wafers may be used to infer the passing or failing of one or more subsequent wafers based on one or more test measurements from a sample set of selected dies of the subsequent wafers. The sample set of selected dies may comprise one or more dies of a wafer.

At step 104, a probability of wafer failure and/or success as related to a sample set of selected dies of a given wafer may be determined in accordance with the one or more test measurements obtained from testing the one or more first wafers. In an exemplary embodiment, the relationship between the one or more test measurements from a sample set of dies of a wafer and the pass (e.g., success) probability and/or fail probability of the wafer may be embodied in a Bayesian network. A Bayesian network will be described in greater detail below with reference to FIG. 2. The determined probabilistic relationship may be used to infer the passing or failing of subsequently tested wafers based on the sample set of selected dies as described above. This technique may avoid the costly process of testing every die of a subsequently tested wafer to confirm a pass status or a fail status.

At step 106, one or more second wafers (e.g., subsequent wafers) are tested. In an exemplary embodiment, only a select number of dies of the one or more second wafers are tested; the one or more dies selected for testing may be determined during analysis of the one or more test measurements from the one or more first wafers (step 104). At step 108, the one or more test measurements from the selected dies of the one or more second wafers are then evaluated in accordance with the pass probability and/or fail probability determined at step 104. A pass status and/or a fail status may be inferred for a given wafer based on the selected dies.

In practice, if at least one of the selected dies of a second wafer fails, a fail status may be designated for the wafer. However, if each one of the selected dies of a wafer pass, a pass status may not be assumed for the wafer because a defective die may be present in the remaining untested portion of the wafer. The present invention addresses this scenario. In an exemplary embodiment, the present invention may infer a failed status for a given wafer even if each one of the selected dies of the given wafer passes. This may be accomplished by analyzing the one or more test measurements from the selected dies in accordance with the determined probabilities described above (step 104). Unlike the present invention, conventional techniques automatically designate a pass status to a wafer when all of the dies of a selected sample set pass, even if the wafer should not have passed due to one or more failed chips existing outside the tested sample set.

At step 110, a pass status and/or a fail status is inferred for the one or more second wafers based on the evaluation of step 108. In an exemplary embodiment, a passing status is not assumed for a given second wafer even if every selected die on the given second wafer passes. Instead, the one or more test measurements from the one or more selected dies may be evaluated with, for example, the determined probability of wafer failure (step 104), which may be embodied in a generated Bayesian network. After a pass status and/or a fail status is inferred for a given wafer, the given wafer is handled accordingly. For example, a failing wafer may be disposed of and a passing wafer may undergo post-processing (e.g., packaging). In the alternative, a wafer tester may authorize the testing of remaining untested dies of a given wafer to confirm its status of pass or fail.

Figure 2:
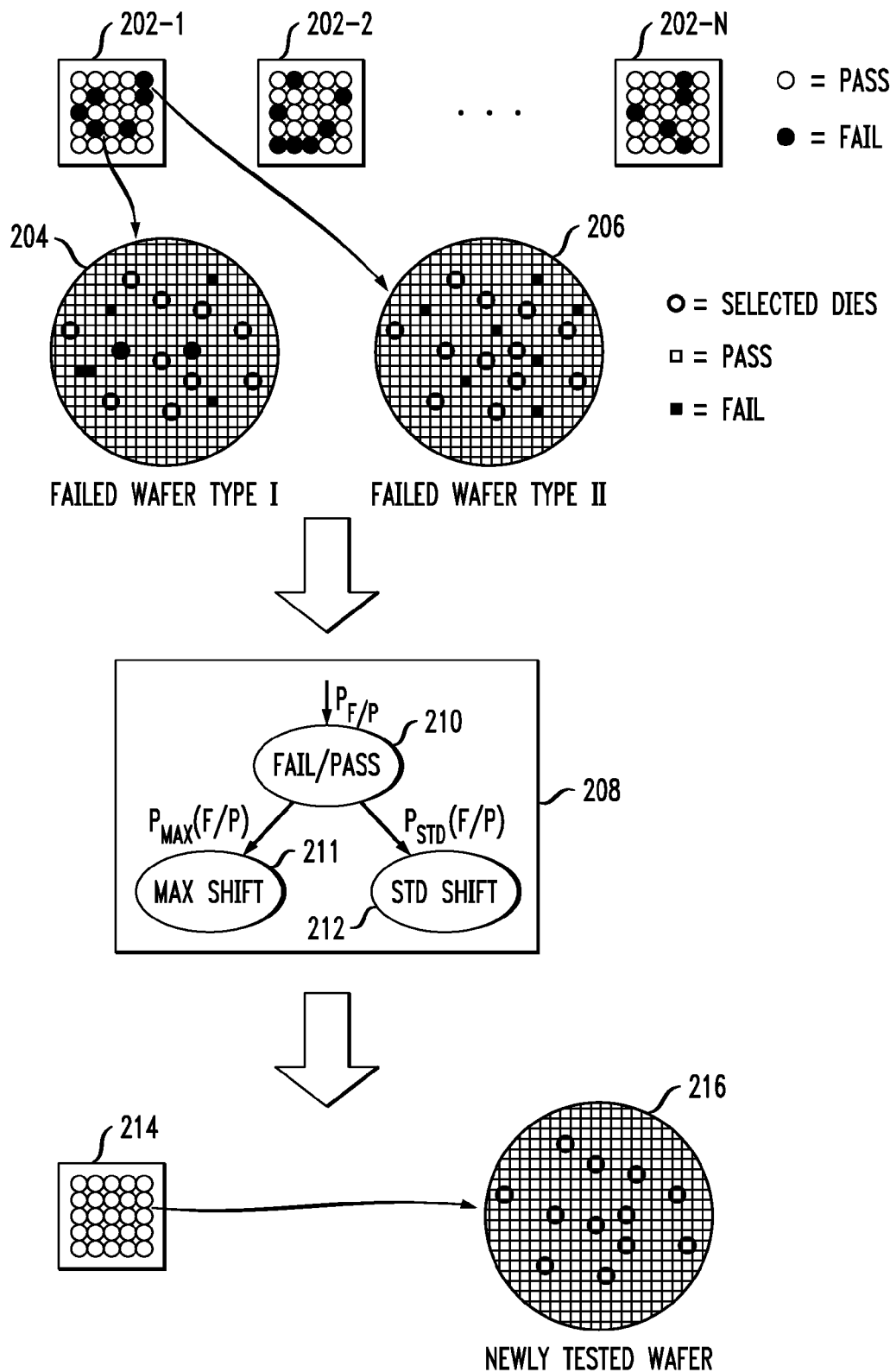
FIG. 2 is a diagram illustrating one embodiment of estimating a quality of one or more wafers using a Bayesian network, according to an embodiment of the present invention.

Referring now to FIG. 2, a diagram illustrates one embodiment of estimating a quality of one or more wafers using a Bayesian network, according to an embodiment of the present invention. In an exemplary embodiment, one or more lots of wafers 202-1, 202-2, ..., 202-N are tested in part or in there entirety in an initial testing phase. The one or more lots 202-1, 202-2, ..., 202-N may be the initial batches of a wafer manufacturing job. In one embodiment, one lot consists of twenty-five wafers and each wafer may comprise X number of dies. The following data may be obtained during the initial testing phase: (1) test measurements for each tested die; (2) test measurements as related to a selected set of tested dies (e.g., a sample set comprising one or more dies); and (3) a passing status and/or a failing status for each wafer. In the example of FIG. 2, the wafers of lots 202-1, 202-2, ..., 202-N are labeled as passing (labeled as a white circle) or failing (labeled as a black circle). A given wafer is awarded a passing status if every die of the given wafer passes. A given wafer is awarded a failing status if at least one of the dies of the given wafer fails. In one embodiment, a die passes if its measurements fall within acceptable manufacturing specifications for a given in-line metrology test.

Wafers 204 and 206 illustrate two types of failed wafers. One type of failed wafer 204 (i.e., TYPE I), comprises failing dies (labeled as black squares) that fall within a selected set of tested dies (circled dies). It should be appreciated that if only the selected set of dies (circled dies) had been tested, a tester can easily determine that wafer 204 is a failed wafer because failed dies would have been detected. In contrast, a tester testing failed wafer 206 (i.e., TYPE II) would not know that wafer 206 was a failed wafer from only testing the selected dies because none of the selected dies of wafer 206 comprise failed dies, i.e., all of the selected dies are passing dies (labeled as white squares). Unlike conventional techniques, the present invention may detect failed wafers that fall within the TYPE II category. It should be noted that the selected dies of failed wafer 204 may be in the same wafer locations as the selected dies of failed wafer 206. Further, the selected dies to be tested on subsequent wafers may be in the same wafer locations as the selected dies of wafers 204 and 206. These one or more dies may be selected because they may provide the most reliable information with regard to the quality of a given wafer.

The relationship between the test measurements from selected dies and the pass probability and/or fail probability of a wafer may be embodied in a probabilistic model 208. In an exemplary embodiment, the probabilistic model 208 is a Bayesian network. The Bayesian network is generated (e.g., trained) using the one or more test measurements obtained from the one or more initially tested wafers described above (e.g., wafers in lots 202-1, 202-2, . . . , 202-N). The network 208 may comprise a root node 210 representing a pass probability and/or fail probability ($P_{F/P}$) of a wafer. In one embodiment, the root node 210 is a binary node that is "0" for fail and "1" for pass.

The formula to set the root node 210 may be as follows:

Probability of Wafer Failure=<r>

Probability of Wafer Passing=1−<r>

In an exemplary embodiment, <r> is calculated for a set of tested wafers. Using the example illustrated in FIG. 2, <r> may be calculated for each tested lot 202-1, 202-2, . . . , 202-N (e.g., a set of twenty-five wafers). In one lot, the value of <r> may be equal to the number of wafers that fail due to failed dies that exist outside the tested set of selected die locations (i.e., failed wafer TYPE II), divided by the total number of tested wafers minus the total number of wafers that fail due to a failed die existing within the tested set of selected die locations (i.e., failed wafer TYPE I).

If there are multiple lots, multiple <r> values may be calculated. The <r> values may be averaged together to produce an average <r> value. In one illustrative example, two wafer lots X and Y are fully tested. The average <r> value may be calculated as follows. Assume that lot X comprises twenty-five wafers where five wafers are TYPE I wafers and five additional wafers are TYPE II wafers. For lot X, <r> equals $$\frac{5}{25-5} = 0.25.$$

Next, assume that lot Y comprises twenty wafers where four wafers are TYPE I wafers and twelve additional wafers are TYPE II wafers. For lot Y, <r> equals $$\frac{12}{20-4} = 0.75.$$

In this example, average <r> is equal to $$\frac{(0.25 + 0.75)}{2} = 0.5.$$

After obtaining an average <r> for the root node 210, relations between the root node 210 and additional die measurement nodes are learned from the one or more obtained test measurements.

In an exemplary level-to-level overlay alignment test example, the root node 210 may comprise a node (e.g., leaves) representing a probability related to a maximum shift 211, $P_{MAX}$(F/P), and/or a node representing a probability related to a standard shift 212, $P_{STD}$(F/P) (e.g., standard deviation shift). The maximum shift node 211 and/or standard shift node 212 may comprise values which define the average boundaries of die measurements for a passing or failing wafer as inferred from initial test measurements. The average boundaries (e.g., ranges) of die measurements are then used to infer the passing or failing of newly tested wafers.

After generating the probabilistic model 208, test measurements are obtained from a newly tested wafer 216 of a lot 214. In an exemplary embodiment, only the selected dies (circled dies) of wafer 216 are tested. It should be appreciated that the selected dies of wafer 216 are in the same wafer locations as previously tested wafers 204 and 206. In this example, twelve dies are selected for testing, however, it should be noted that any number of dies may be selected for testing and it is not required to select exactly twelve dies as illustrated in this example. These twelve die locations may be chosen because they best represent the overall status of a wafer (i.e., they are the most informative with relation to the status of a given wafer). If one of the twelve dies is a failing die, wafer 216 may be labeled as a failed wafer. In the alternative, if each of the twelve dies passes, the test measurements from the twelve dies may be evaluated in accordance with the probabilistic model 208 to infer a passing or failing status for the wafer.

In one embodiment, the obtained test measurements from the selected dies of the newly tested wafer 216 are averaged and compared to the leaves of the Bayesian network 208. If the averaged test measurements fall outside the calculated boundaries of maximum shift 211 and/or the boundaries of standard shift 212, the tester may infer a failing status for the newly tested wafer 216 even if every selected die (circled dies) maintains a passing quality. It should be appreciated that the proposed techniques may prevent a false passing or false positive scenario in sample testing, in which a wafer passes because failed dies go undetected.

Figure 3:
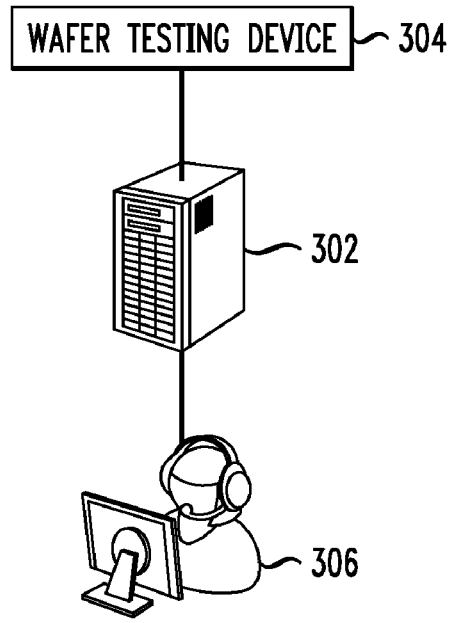
FIG. 3 is a diagram illustrating an exemplary system for carrying out the methodology of FIG. 1, according to an embodiment of the present invention.

Referring now to FIG. 3, a diagram illustrates an exemplary system for carrying out the methodology of FIG. 1, according to an embodiment of the present invention. In an exemplary embodiment, methodology 100 of FIG. 1 is carried out at a computer-based device (e.g., server) 302. Server 302 may be coupled to a wafer testing device 304. In an illustrative embodiment, the wafer testing device 304 is a level-to-level overlay alignment tester; however, it should be noted that the wafer testing device 304 may be any circuit testing device and is not limited to the embodiments described herein. The wafer testing device 304 tests and obtains one or more test measurements from one or more tested wafers. The one or more test measurements are then forwarded to server 302. Server 302 may use the one or more test measurements to carry out methodology 100. In an exemplary embodiment, server 302 may also be coupled to a user interface 306, which may be used by one or more users to oversee the wafer testing process.

Figure 4:
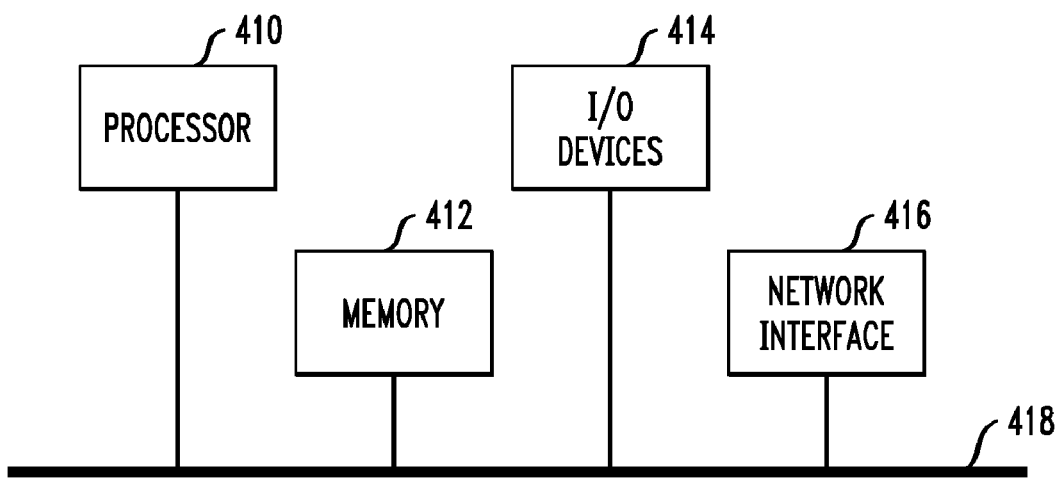
FIG. 4 is a diagram illustrating an illustrative hardware implementation of a computing system in accordance with which one or more components/methodologies of the present invention may be implemented, according to an embodiment of the present invention.

Referring now to FIG. 4, block diagram 400 illustrates an exemplary hardware implementation of a computing system in accordance with which one or more components/methodologies of the invention (e.g., components/methodologies described in the context of FIGS. 1-3) may be implemented, according to an embodiment of the present invention.

As shown, the techniques for estimating a quality of one or more wafers may be implemented in accordance with a processor 410, a memory 412, I/O devices 414, and a network interface 416, coupled via a computer bus 418 or alternate connection arrangement.

It is to be appreciated that the term "processor" as used herein is intended to include any processing device, such as, for example, one that includes a CPU (central processing unit) and/or other processing circuitry. It is also to be understood that the term "processor" may refer to more than one processing device and that various elements associated with a processing device may be shared by other processing devices.

The term "memory" as used herein is intended to include memory associated with a processor or CPU, such as, for example, RAM, ROM, a fixed memory device (e.g., hard drive), a removable memory device (e.g., diskette), flash memory, etc. Such memory may be considered a computer-readable storage medium.

In addition, the phrase "input/output devices" or "I/O devices" as used herein is intended to include, for example, one or more input devices (e.g., keyboard, mouse, scanner, etc.) for entering data to the processing unit, and/or one or more output devices (e.g., speaker, display, printer, etc.) for presenting results associated with the processing unit.

Still further, the phrase "network interface" as used herein is intended to include, for example, one or more transceivers to permit the computer system to communicate with another computer system via an appropriate communications protocol.

Software components including instructions or code for performing the methodologies described herein may be stored in one or more of the associated memory devices (e.g., ROM, fixed or removable memory) and, when ready to be utilized, loaded in part or in whole (e.g., into RAM) and executed by a CPU.

As will be appreciated by one skilled in the art, the present invention may be embodied as a system, method, or computer program product. Accordingly, the present invention may take the form of an entirely hardware embodiment, an entirely software embodiment (including firmware, resident software, micro-code, etc.), or an embodiment combining software and hardware aspects that may all generally be referred to herein as a "circuit," "module," or "system." Furthermore, the present invention may take the form of a computer program product embodied in any tangible medium of expression having computer-usable program code embodied in the medium.

Any combination of one or more computer-usable or computer-readable medium(s) may be utilized. The computer-usable or computer-readable medium may be, for example but not limited to, an electronic, magnetic, optical, electromagnetic, infrared, or semiconductor system, apparatus, or device. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or flash memory), an optical fiber, a portable compact disc read-only memory (CD-ROM), an optical storage device, or a magnetic storage device.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Further, the present invention was described above with reference to diagrams of methods, apparatus (systems), and computer program products according to embodiments of the invention. It will be understood that individual functions/acts in the diagrams, and combinations of functions/acts in the diagrams, may be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the diagrams.

These computer program instructions may also be stored in a computer-readable medium that may direct a computer or other programmable data processing apparatus to function in a particular manner, such that the instructions stored in the computer-readable medium produce an article of manufacture including instruction means which implement the functions/acts specified in the diagrams.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the diagrams.

The diagrams illustrate the architecture, functionality, and operation of possible implementations of systems, methods, and computer program products according to various embodiments of the present invention. In this regard, individual functions/acts in the diagrams may represent a module, segment, or portion of code, which comprises one or more executable instructions for implementing the specified logical function(s). It should also be noted that, in some alternative implementations, the functions/acts in the diagrams may occur out of the order noted in the diagrams. For example, two steps shown in succession may, in fact, be executed substantially concurrently, or the steps may sometimes be executed in the reverse order, depending upon the functionality involved. It will also be noted that individual functions/acts in the diagrams, and combinations of functions/acts in the diagrams, may be implemented by special purpose hardware-based systems that perform the specified functions or acts, or combinations of special purpose hardware and computer instructions.

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A method for estimating a quality of one or more wafers, the method comprising:
    testing one or more first wafers comprising one or more first dies;
    determining a probability of wafer failure in accordance with one or more first test measurements of the one or more first dies; and
    inferring at least one of a pass status and a fail status of one or more second wafers by testing a select one or more second dies of the one or more second wafers and evaluating one or more second test measurements of the select one or more second dies in accordance with the determined probability of wafer failure;
    wherein said evaluating comprises (i) determining if each of the select one or more second dies of a given second wafer pass based on the one or more second test measurements; and (ii) even if each of the select one or more second dies of the given second wafer pass based on the one or more second test measurements, inferring whether the given second wafer has failed based on the determined probability of wafer failure.

2. The method of claim 1, wherein the step of determining a probability of wafer failure further comprises generating a Bayesian network in accordance with the one or more first test measurements of the one or more first dies.

3. The method of claim 2, wherein the one or more first test measurements are in accordance with a level-to-level overlay alignment test.

4. The method of claim 3, wherein the Bayesian network comprises a root node representing at least one of a pass probability of a wafer and a fail probability of a wafer.

5. The method of claim 4, wherein the root node comprises at least one of a node representing a probability related to a maximum shift and a node representing a probability related to a standard shift.

6. The method of claim 1, wherein the probability of wafer failure is a probability of false positive, such that the probability of false positive represents the probability that the given second wafer fails even if each of the select one or more second dies of the given second wafer pass.

7. The method of claim 6, wherein the probability of false positive is equal to a number of one or more failed first wafers in which each of a select one or more first dies of a corresponding failed wafer pass divided by, a total number of tested first wafers minus a number of one or more failed first wafers in which one of the select one or more first dies of a corresponding failed wafer fails.

8. The method of claim 1, wherein a number of the select one or more second dies of a given second wafer is less than a total number of second dies of the given second wafer.

9. An apparatus for estimating a quality of one or more wafers, the apparatus comprising:
a memory; and
at least one processor coupled to the memory and operative to: test one or more first wafers comprising one or more first dies; determine a probability of wafer failure in accordance with one or more first test measurements of the one or more first dies; and infer at least one of a pass status and a fail status of one or more second wafers by testing a select one or more second dies of the one or more second wafers and evaluating one or more second test measurements of the select one or more second dies in accordance with the determined probability of wafer failure;
wherein said evaluating comprises (i) determining if each of the select one or more second dies of a given second wafer pass based on the one or more second test measurements; and (ii) even if each of the select one or more second dies of the given second wafer pass based on the one or more second test measurements, inferring whether the given second wafer has failed based on the determined probability of wafer failure.

10. The apparatus of claim 9, wherein the at least one processor is further operative to generate a Bayesian network in accordance with the one or more first test measurements of the one or more first dies.

11. The apparatus of claim 10, wherein the one or more first test measurements are in accordance with a level-to-level overlay alignment test.

12. The apparatus of claim 11, wherein the Bayesian network comprises a root node representing at least one of a pass probability of a wafer and a fail probability of a wafer.

13. The apparatus of claim 12, wherein the root node comprises at least one of a node representing a probability related to a maximum shift and a node representing a probability related to a standard shift.

14. The apparatus of claim 9, wherein the probability of wafer failure is a probability of false positive, such that the probability of false positive represents the probability that the given second wafer fails even if each of the select one or more second dies of the given second wafer pass.

15. The apparatus of claim 14, wherein the probability of false positive is equal to a number of one or more failed first wafers in which each of a select one or more first dies of a corresponding failed wafer pass divided by, a total number of tested first wafers minus a number of one or more failed first wafers in which one of the select one or more first dies of a corresponding failed wafer fails.

16. The apparatus of claim 9, wherein a number of the select one or more second dies of a given second wafer is less than a total number of second dies of the given second wafer.

17. A computer program product for estimating a quality of one or more wafers, the computer program product comprising:
a non-transitory computer-readable storage medium having stored thereon program instructions for execution by a processor, the program instructions comprising:
a first program instruction to test one or more first wafers comprising one or more first dies;
a second program instruction to determine a probability of wafer failure in accordance with one or more first test measurements of the one or more first dies; and
a third program instruction to infer at least one of a pass status and a fail status of one or more second wafers by testing a select one or more second dies of the one or more second wafers and evaluating one or more second test measurements of the select one or more second dies in accordance with the determined probability of wafer failure;
wherein said evaluating comprises (i) determining if each of the select one or more second dies of a given second wafer pass based on the one or more second test measurements; and (ii) even if each of the select one or more second dies of the given second wafer pass based on the one or more second test measurements, inferring whether the given second wafer has failed based on the determined probability of wafer failure.

18. The computer program product of claim 17, wherein the program instructions further comprise a fourth program instruction to generate a Bayesian network in accordance with the one or more first test measurements of the one or more first dies.

19. The computer program product of claim 17, wherein the probability of wafer failure is a probability of false positive, such that the probability of false positive represents the probability that the given second wafer fails even if each of the select one or more second dies of the given second wafer pass.

20. The computer program product of claim 17, wherein a number of the select one or more second dies of a given second wafer is less than a total number of second dies of the given second wafer.

* * * * *